US009627884B2

(12) United States Patent
Kaufman et al.

(10) Patent No.: US 9,627,884 B2
(45) Date of Patent: Apr. 18, 2017

(54) ELECTROSTATIC DISCHARGE PROTECTION FOR MODULAR EQUIPMENT

(71) Applicant: ROCKWELL AUTOMATION TECHNOLOGIES, INC., Mayfield Heights, OH (US)

(72) Inventors: Andrew P. Kaufman, Milwaukee, WI (US); Keith O. Satula, New Berlin, WI (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 129 days.

(21) Appl. No.: 14/577,729

(22) Filed: Dec. 19, 2014

(65) Prior Publication Data

US 2015/0103453 A1    Apr. 16, 2015

Related U.S. Application Data

(63) Continuation of application No. 13/160,880, filed on Jun. 15, 2011, now Pat. No. 8,923,012.

(51) Int. Cl.
*H02H 1/00* (2006.01)
*H02H 9/04* (2006.01)
(Continued)

(52) U.S. Cl.
CPC .......... *H02H 9/045* (2013.01); *H05K 7/1481* (2013.01); *H05K 9/0067* (2013.01);
(Continued)

(58) Field of Classification Search
USPC .......................................... 361/56, 212, 220
See application file for complete search history.

(56) References Cited

U.S. PATENT DOCUMENTS 4,512,833 A    4/1985 Kridl et al.
4,808,115 A    2/1989 Norton et al.
(Continued)

FOREIGN PATENT DOCUMENTS

DE    9103080 U1    7/1992
DE    9412375 U1    9/1994

OTHER PUBLICATIONS

"Installation Instruction PanelView Plus 700 to 1500 and PanelView Plus Compact 1000 Terminals and Display Modules", retrieved from the internet: URL http://literature.rockwellautomation.com/idc/groups/literature/documents/in/2711p-in001_-en-p.pdf on Aug. 5, 2015, 32 pages.

*Primary Examiner* — Danny Nguyen (57) ABSTRACT

A modular electrical assembly that includes a first enclosure that physically couples to a second enclosure to form a modular stackup arrangement. The first enclosure having a connection to an electrical ground for discharging electrostatic discharge (ESD) energy of ESD events of the modular electrical assembly. The first enclosure configured to enclose first circuitry and comprising at least one generally flat surface to electrically couple to the second enclosure. The second enclosure configured to enclose second circuitry and comprising at least one surface with a plurality of raised contact nodes arranged such that when in contact with the one surface of the first enclosure electrostatic discharge energy is directed over the raised contact nodes to the one surface of the first enclosure for discharging portions of the ESD energy through the electrical ground of the first enclosure.

18 Claims, 6 Drawing Sheets

(51) Int. Cl.
- H05K 9/00 (2006.01)
- H05K 7/14 (2006.01)
- G01R 31/3185 (2006.01)
- H01L 23/62 (2006.01)

(52) U.S. Cl.
CPC ...... *G01R 31/318513* (2013.01); *H01L 23/62* (2013.01); *H01L 2924/14* (2013.01); *Y10T 29/49002* (2015.01)

(56) References Cited

U.S. PATENT DOCUMENTS

| | | | |
|---|---|---|---|
| 5,631,959 A | 5/1997 | Messina et al. | |
| 6,797,882 B1 | 9/2004 | Crane et al. | |
| 7,122,741 B2 | 10/2006 | Gossman | |
| 7,567,419 B2 * | 7/2009 | Lu | H04M 1/23 361/112 |
| 2006/0050184 A1 | 3/2006 | McMiller et al. | |
| 2006/0134982 A1 | 6/2006 | Zarganis et al. | |
| 2007/0004253 A1 | 1/2007 | Lee et al. | |
| 2008/0080142 A1 | 4/2008 | Chen et al. | |
| 2008/0100977 A1 | 5/2008 | Shreiner et al. | |
| 2008/0188125 A1 | 8/2008 | Horiuchi et al. | |
| 2009/0236707 A1 | 9/2009 | Chen et al. | |
| 2010/0014016 A1 | 1/2010 | Chen et al. | |
| 2010/0193937 A1 | 8/2010 | Nagamatsu et al. | |
| 2010/0326717 A1 | 12/2010 | Lin et al. | |
| 2011/0128663 A1 | 6/2011 | Horiuchi et al. | |
| 2011/0255250 A1 | 10/2011 | Dinh et al. | |
| 2011/0255850 A1 | 10/2011 | Dinh et al. | |
| 2011/0304010 A1 * | 12/2011 | Jiang | H01L 23/3677 257/528 |
| 2012/0224336 A1 | 9/2012 | Lin et al. | |
| 2012/0287587 A1 | 11/2012 | Los | |

\* cited by examiner

ELECTROSTATIC DISCHARGE PROTECTION FOR MODULAR EQUIPMENT

RELATED APPLICATIONS

This application is a continuation of, and claims priority to, U.S. patent application Ser. No. 13/160,880, filed on Jun. 15, 2011, entitled "ELECTROSTATIC DISCHARGE PROTECTION FOR MODULAR EQUIPMENT."

TECHNICAL FIELD

Aspects of the disclosure are related to the field of equipment enclosures and enclosure interfacing, and in particular, electrostatic discharge (ESD) protection in modular equipment.

TECHNICAL BACKGROUND

Equipment enclosures are typically employed to encase electronic components, such as circuit card assemblies, printed circuit boards, discrete electrical components, or other electrical equipment. The equipment enclosures provide protection from the surrounding environment, such as dust, dirt, vibration, electrical interference, or other environmental protection. Also, when electronic equipment is used in human-equipment environments, such as when a human operator must interact with the equipment, electrostatic discharge (ESD) events can occur. ESD events can include static electrical discharges from a human operator or handler of electronic equipment to the equipment itself, among other events. The ESD energy typically follows a path to an electrical ground from the ESD source, such as a finger or clothing. However, the ESD energy may pass through sensitive electrical components, such as integrated circuits, along the path to electrical ground, either causing temporary disruption or permanently damaging the sensitive equipment.

In modular equipment, such as when multiple equipment enclosures are stacked to form the equipment, gaps can exist between the enclosures or modules which can allow ESD energy to be transported along unpredictable or undesirable routes. Conductive gaskets, foams, or meshes can aid in sealing the gaps between modules. However, these gaskets add manufacturing costs and extra parts to equipment assemblies, and can be unsuited for certain environmental or industrial conditions.

Overview

What is disclosed is a modular electrical assembly. The modular electrical assembly comprises a modular stackup arrangement of a first enclosure and a second enclosure. The first enclosure physically couples to the second enclosure to form the modular stackup arrangement. The first enclosure includes a connection to an electrical ground for discharging electrostatic discharge (ESD) energy of ESD events of the modular electrical assembly. The first enclosure is configured to enclose first circuitry and comprises at least one generally flat surface to electrically couple to the second enclosure. The second enclosure is configured to enclose second circuitry and has at least one surface with a plurality of raised contact nodes arranged such that when in contact with the generally flat surface of the first enclosure electrostatic discharge energy is directed over the raised contact nodes to the first enclosure for discharging portions of the ESD energy through the electrical ground of the first enclosure.

What is also disclosed is a modular electrical assembly that includes a first enclosure that physically couples to a second enclosure to form the modular stackup arrangement. The first enclosure has a connection to an electrical ground for at least discharging electrostatic discharge (ESD) energy of ESD events of the modular electrical assembly. The first enclosure is configured to enclose first circuitry and has at least one surface with a plurality of raised contact nodes such that when in contact with a generally flat surface of the second enclosure, at least portions of the ESD energy received at the second enclosure is directed over the raised contact nodes from the generally flat surface of the second enclosure for discharging the portions of the ESD energy through the electrical ground of the first enclosure.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Figure 1:
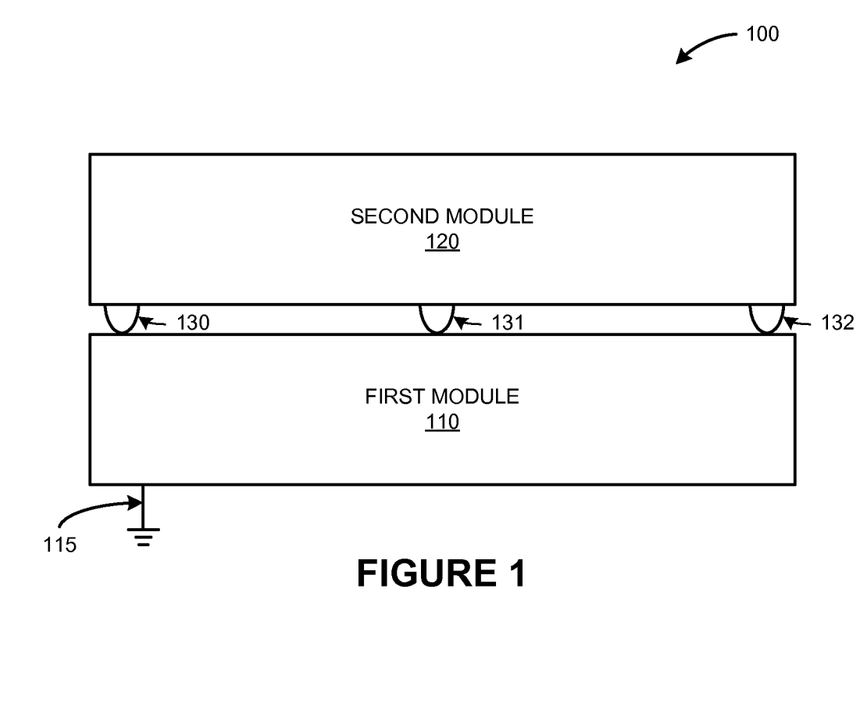
FIG. 1 is a system diagram illustrating an example of an equipment enclosure system.
Figure 2:
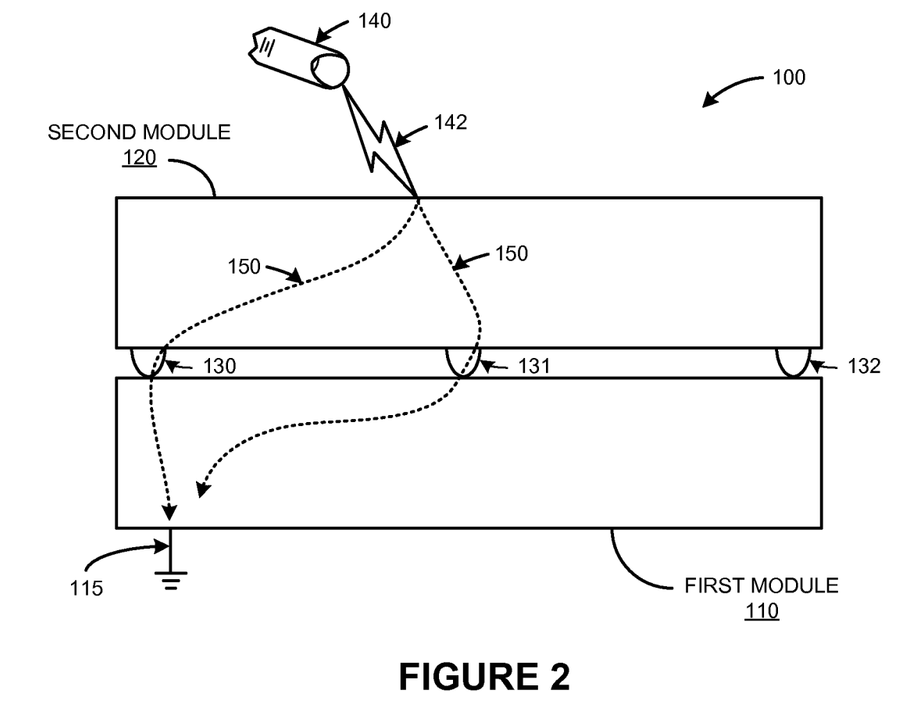
FIG. 2 is a system diagram illustrating an example of an equipment enclosure system.

FIGS. 1 and 2 are system diagrams illustrating equipment enclosure system 100. Equipment enclosure system 100 could comprise a modular equipment enclosure system, such as a modular visualization display panel, human-machine interface equipment, computer system enclosure, control panel enclosure system, graphics terminal, operator panel, operator interface, or industrial computer, among other modular equipment enclosures. FIGS. 1 and 2 include first module 110, second module 120, and raised contact nodes 130-132. FIG. 2 also includes ESD source 140, electrostatic discharge 142, and discharge paths 150.

First module 110 includes at least one surface and a connection to electrical ground 115. The one surface of first module 110 in this example is the surface shown facing second module 120, although other surfaces could be referenced. Electrical ground 115 includes an electrical connection to a ground potential for electrical equipment associated with first module 110 or second module 120. Electrical ground 115 could include a chassis ground, digital ground, analog signal ground, neutral lead, common lead, or other electric reference potential connection.

Second module 120 also includes at least one surface. The one surface of second module 120 in this example is the surface shown facing first module 110, although other surfaces could be referenced. The one surface of second module 120 includes raised contact nodes 130-132 arranged on the one surface of second module 120 such that when in contact with the one surface of first module 110, electrostatic discharge (ESD) energy is directed over at least one of raised contact nodes 130-132 to the one surface of first module 110. Although raised contact nodes 130-132 are arranged on the one surface of second module 120 in this example, it should be understood that raised contact nodes 130-132 could instead be arranged on the one surface of first module 110 in other examples, including combinations of arrangements thereof.

First module 110 and second module 120 could each be comprised of a conductive material, such as a metal composition. In other examples, first module 110 or second module 120 could be partly comprised of a non-conductive material, and the one surface of each module is comprised of a conductive material. First module 110 and second module 120 could each enclose electrical circuits, circuit card assemblies, printed circuit boards, subassemblies, user-accessible ports, displays, user-interface equipment, or other electrical or mechanical equipment. Either of first module 110 and second module 120 could act as a Faraday cage surrounding electronic components. Although first module 110 and second module 120 are shown in FIGS. 1 and 2 in a two-dimensional side view representation for clarity, it should be understood that first module 110 and second module 120 could have been shown as three-dimensional enclosures, such as casings, equipment chassis, or other equipment enclosures, with raised contact nodes 130-132 arranged along a seam or edge of first module 110 or second module 120.

Raised contact nodes 130-132 each comprise raised protrusions or bumps above the one surface of second module 120, disposed on the one surface of second module 120. In some examples, raised contact nodes 130-132 are each formed from the same material as the one surface of second module 120, such as being machined from the same piece of material or formed in the same casting. In typical examples, raised contact nodes 130-132 each comprise a conductive material, such as a metal composition. The conductive material could be of the same composition as the one surface of second module 120, the same composition as the one surface of first module 110, or of a different composition. It should be understood that the shape of raised contact nodes 130-132 shown in FIGS. 1 and 2 is merely representative of the raised protrusions above the one surface of second module 120. Other shapes could be employed for each of raised contact nodes 130-132, such as a polyhedron, pyramid, dome, round, oblate spheroid, half-ovate, ellipsoid, hemisphere, spike, tapered, teardrop, or portions thereof.

FIG. 2 includes ESD source 140, as represented by a finger. Other sources of ESD energy could be employed, such as clothing, equipment, peripheral connectors, peripheral equipment, or other environmental sources. ESD source 140 discharges electrical energy as an electrostatic discharge 142 into equipment enclosure system 100. The first point where the ESD energy is transferred into equipment enclosure system 100 is on second module 120. Exemplary discharge paths are shown in FIG. 1, namely discharge paths 150. In this example, the ESD energy is discharged along discharge paths 150 through second module 120, over raised contact nodes 130-131, and to first module 110. Since first module 110 is connected to electrical ground 115, the ESD energy is eventually discharged to electrical ground 115 once conducted to first module 110. It should be understood that other electrostatic discharge paths could have been taken by electrostatic discharge 142, and discharge paths 150 are merely representative of possible paths through at least one of raised contact nodes 130-132. ESD energy may follow the outer surface of enclosure 120 to raised contact nodes 130-132.

Typically, ESD energy will follow the path of least resistance to a lower voltage potential, such as electrical ground 115. Without raised contact nodes 130-132, the ESD energy of electrostatic discharge 142 would find an undesirable, unpredictable path to electrical ground 115 or to other ground potentials. This undesirable path could include a path through electronic circuits, or elements thereof, such as decoupling capacitors, integrated circuits, transient protection circuitry, printed circuit boards, printed circuit board mounting elements such as standoffs and screws, or other undesirable paths. However, with the addition of conductive bumps, such as raised contact nodes 130-132, the ESD energy of electrostatic discharge 142 is directed through second module 120 and along at least one of raised contact nodes 130-132 through discharge paths 150 to electrical ground 115. The elements of electronic circuits of first module 110 or second module 120 are thus protected from ESD energy. The enclosure-to-enclosure discharge pathway is shown in this example, and thus sensitive electronic circuitry is not traversed with excess ESD energy.

In other examples, the ESD energy may only be partially carried by surfaces of the enclosures or modules, and individual internal electrical components may still receive some exposure to ESD energy. However, individual internal electrical components would instead be only exposed to less than the total ESD energy of electrostatic discharge 142 due to multiple discharge paths by placement of raised contact nodes. For example, individual ones of discharge paths 150 could traverse electrical circuitry of second module 120 or first module 110. However, since the total ESD energy is dispersed across multiple ones of raised contact nodes 130-132, individual components in the electrical circuitry may only see a portion of the total ESD energy. Further examples are discussed herein.

Figure 3:
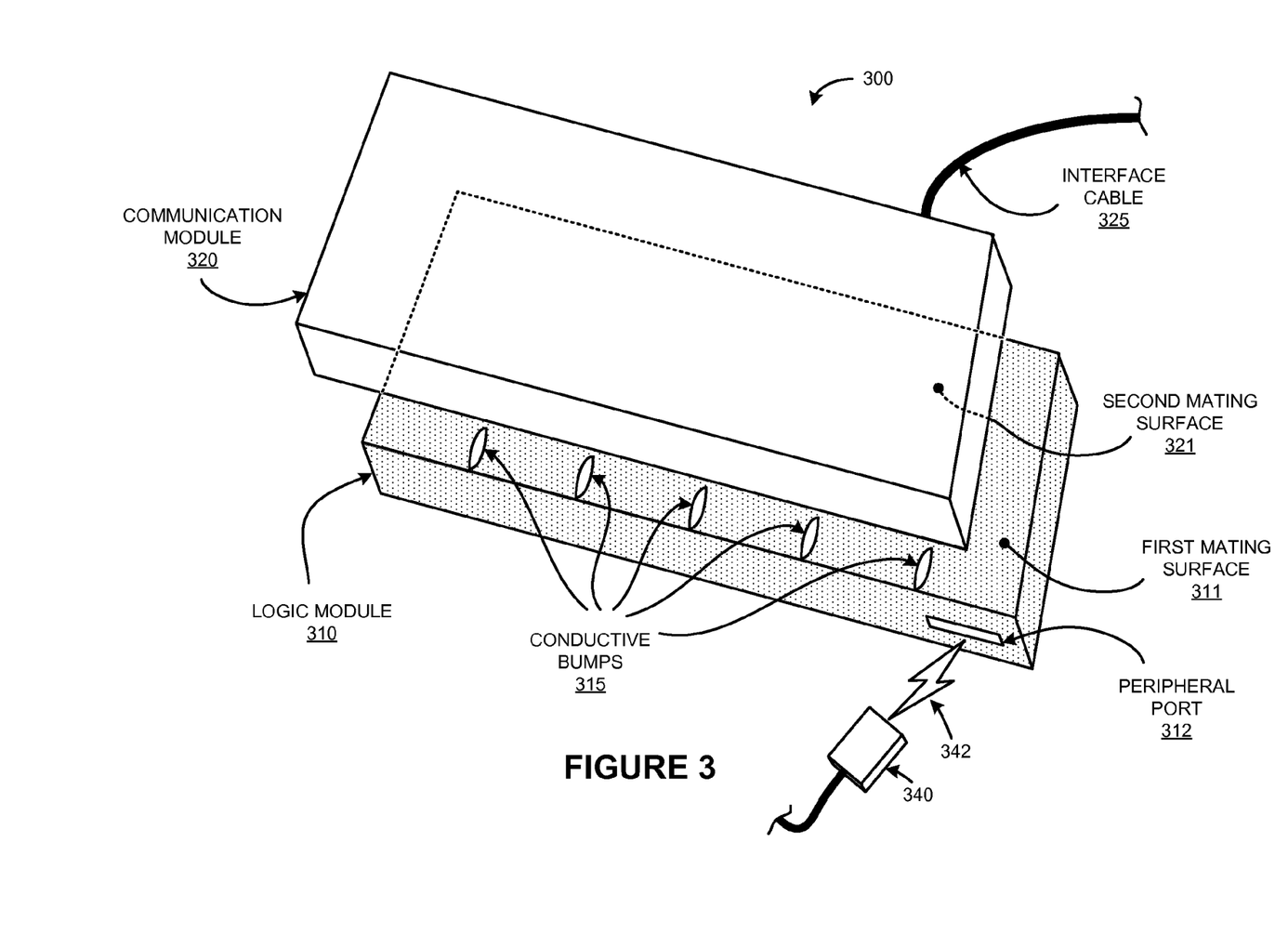
FIG. 3 is a system diagram illustrating an oblique projection of an example of an equipment enclosure system.

FIG. 3 is a system diagram illustrating an oblique projection of equipment enclosure system 300. Equipment enclosure system 300 is a modular equipment enclosure system, which includes logic module 310 and communication module 320. Logic module 310 and communication module 320 join together in a stackable configuration, where each module mates with the other along a mating surface, namely first mating surface 311 for logic module 310 and second mating surface 321 for communication module 320. Portions of logic module 310 and communication module 320 could overlap each other when joined in some examples. Although two modules are shown in FIG. 3, equipment enclosure system 300 could include further stacked modules or different modules, such as a display module, user interface module, machine interface module, control panel, or other modules. Also, although logic module 310 and communication module 320 are shown a distance apart in FIG. 3, both modules would be joined closely to each other in normal usage. The semi-exploded view in FIG. 3 is employed for clarity.

In this example, logic module 310 includes electronic logic portions, such as processing system portions or user-interface portions and includes peripheral port 312. Peripheral port 312 is a user-accessible connection for a peripheral device, such as for connecting a keyboard, mouse, storage device, or other peripheral for use with logic module 310. In this example, peripheral connector 340 is intended to mate with peripheral port 312. Peripheral port 312 could be a universal-serial bus (USB) port, Ethernet port, flash memory interface, mass storage device interface, serial port, video port, audio port, or other data input or output port. In typical examples, peripheral port 312 includes a conductive surround or shield portion which allows for a conductive physical connection between elements of peripheral port 312 with the case of logic module 310, such as a metallic shield surrounding the signaling pins, power pins, or electrical contacts of peripheral port 312.

Logic module 310 also includes conductive bumps 315. Conductive bumps 315 are disposed along a first edge of first mating surface 311. The first edge could be the longest linear edge of first mating surface 311 although other configurations could be employed, such as an edge with the greatest potential or possibility for physical or electrical gapping, as in the longest mating edge, the most curved edge, or the edge with the most complex edge features, among others. Logic module 310 and communication module 320 join together in a stackable configuration, and couple through conductive bumps 315. Conductive bumps 315 allow discrete modules to electrically interface through conductive bumps 315, namely second mating surface 321 of communication module 320 contacts first mating surface 311 of logic module 310 through conductive bumps 315. When first mating surface 311 is in contact with second mating surface 321, electrostatic discharge (ESD) energy received by logic module 310 is directed over at least one of conductive bumps 315 to second mating surface 321.

Conductive bumps 315 each comprise halved-ellipsoid raised protrusions which protrude above first mating surface 311. In this example, conductive bumps 315 are each formed from the same material as first mating surface 311, such as being machined from the same piece of material or formed in the same casting. Conductive bumps 315, and likewise first mating surface 311, comprise a conductive material, such as a metal composition. The conductive material could be of the same composition as second mating surface 321, or a different composition.

Communication module 320 also encloses electronic circuit portions, which may include similar or different types of electronic circuit portions as logic module 310. Communication module 320 interfaces elements of logic module 310 to further systems and equipment through interface cable 325. Communication module 320 is attached electrically to interface cable 325 in this example. The electrical connection could be achieved through a ground wire, shield, braid, or other conductive coupling to interface cable 325. Interface cable 325 could include further elements, such as signaling wires, optical fiber, communication cables, or other communication, power, or grounding elements. In this example, interface cable 325 is also in electrical connection with a ground potential, not shown for clarity. When ESD energy is received by second mating surface 321, the ESD energy is conducted by communication module 320 to interface cable 325 for discharge to a ground potential.

In this example, logic module 310 and communication module 320 are each modular cases, used to enclose electronic circuit portions, among other portions, and each includes a mating surface, namely first mating surface 311 and second mating surface 321. The portions that each of logic module 310 and communication module 320 encase might only be partially encased in some examples. Also in this example, second mating surface 321 is formed from the same piece of material as the case of communication module 320. Likewise, first mating surface 311 and conductive bumps 315 are formed from the same piece of material as the case of logic module 310.

The ESD source is shown as peripheral connector 340 in FIG. 3. Other sources of ESD energy could be employed, such as clothing, humans, equipment, or other environmental sources. Peripheral connector 340 discharges electrical energy as an electrostatic discharge 342 into equipment enclosure system 300. The first point where the ESD energy is transferred into equipment enclosure system 300 is at peripheral port 312 of logic module 310. In this example, the ESD energy is discharged through a shield or surround portion of peripheral port 312 or peripheral connector 340 to the outside case surface of logic module 310 and then to first mating surface 311. First mating surface 311 includes conductive bumps 315, which contact second mating surface 321, and the ESD energy is discharged across at least one of conductive bumps 315 to second mating surface 321. The ESD energy is further discharged through communication module 320, such as along the outer case surface of communication module 320 to interface cable 325.

It should be understood that other electrostatic discharge paths be taken by electrostatic discharge 342. For example, individual electrical components within logic module 310 or communication module 320 may still receive some exposure to ESD energy, but instead be only exposed to less than the total ESD energy of electrostatic discharge 342 due to multiple discharge paths dispersing the total ESD energy over multiple conductive bumps 315. In this manner, any individual internal electrical component may see only a portion of the total ESD energy, as individual portions of the total ESD energy are directed through different discharge paths by individual ones of conductive bumps 315.

Figure 4:
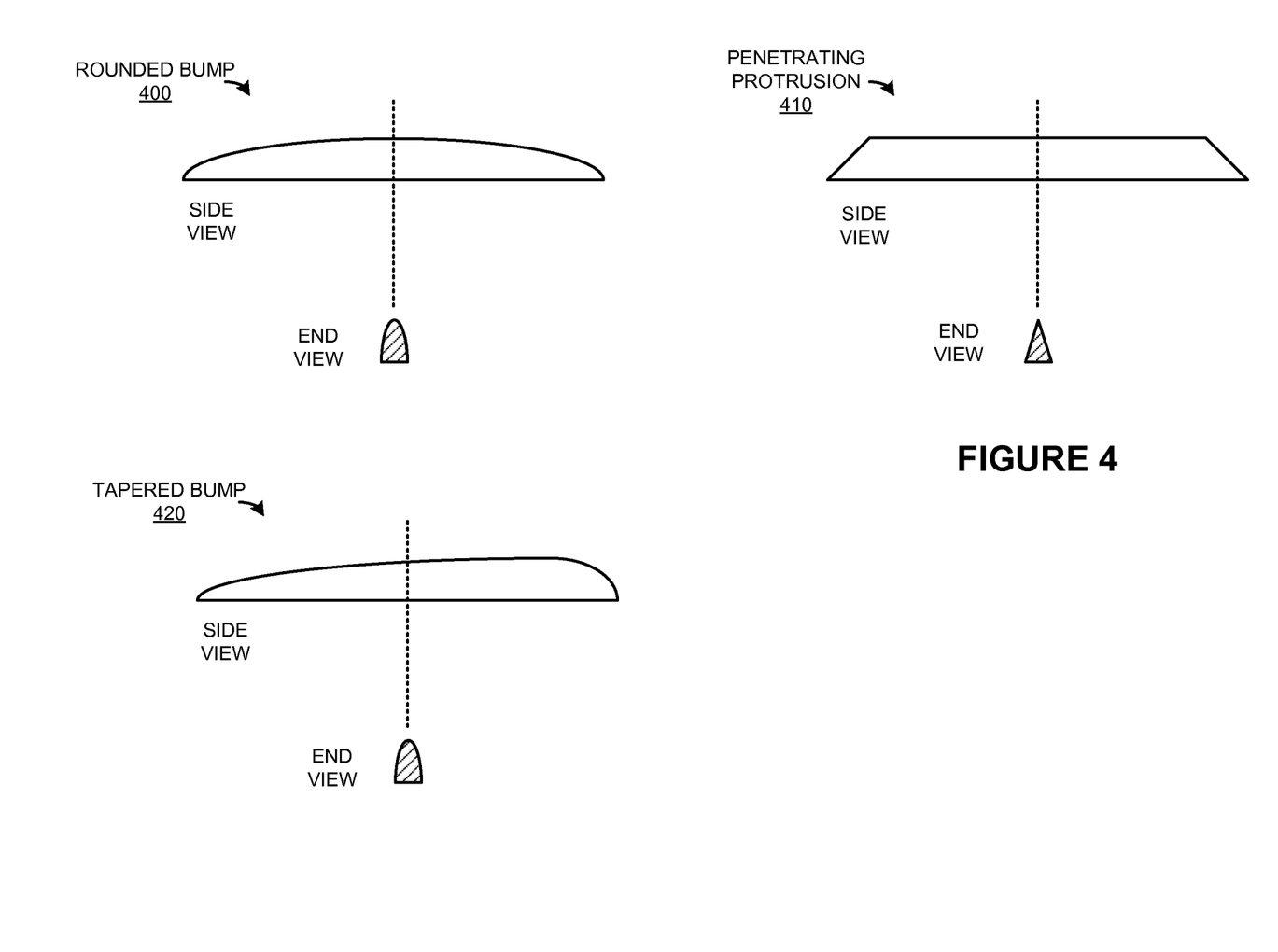
FIG. 4 is a view diagram illustrating examples of raised contact nodes.

FIG. 4 is a view diagram of illustrating examples of raised contact nodes. In FIG. 4, three examples of raised contact nodes are shown, although further configurations could be used. Each of the examples is shown in a side view and an end view to illustrate the shape of the raised contact nodes. Also, each of the examples could be comprised of the various materials described herein. The first example is rounded bump 400, the second example is penetrating protrusion 410, and the third example is tapered bump 420.

Rounded bump 400 comprises a smooth, contoured top edge, similar to a halved ellipsoid or ovoid shape. Rounded bump 400 is disposed on a surface by the flat bottom side of rounded bump 400, and configured to contact a mating surface through the contoured top side. Rounded bump 400 could be configured to deform the mating surface when in contact with the mating surface.

Penetrating protrusion 410 comprises a sharp, angled top edge, similar to a truncated pyramid or knife shape. Penetrating protrusion 410 is disposed on a surface by the flat bottom side of penetrating protrusion 410, and configured to penetrate a mating surface through the sharp top side. Penetrating protrusion 410 could be configured to penetrate partially into a mating surface, possibly through a non-conductive layer of the mating surface to reach a conductive later of the mating surface.

Tapered bump 420 comprises a smooth, tapered top edge, similar to a halved teardrop shape. Tapered bump 420 is disposed on a surface by the flat bottom side of tapered bump 420, and configured to contact a mating surface through the tapered top side. Tapered bump 420 could be configured to deform the mating surface when in contact with the mating surface.

Figure 5:
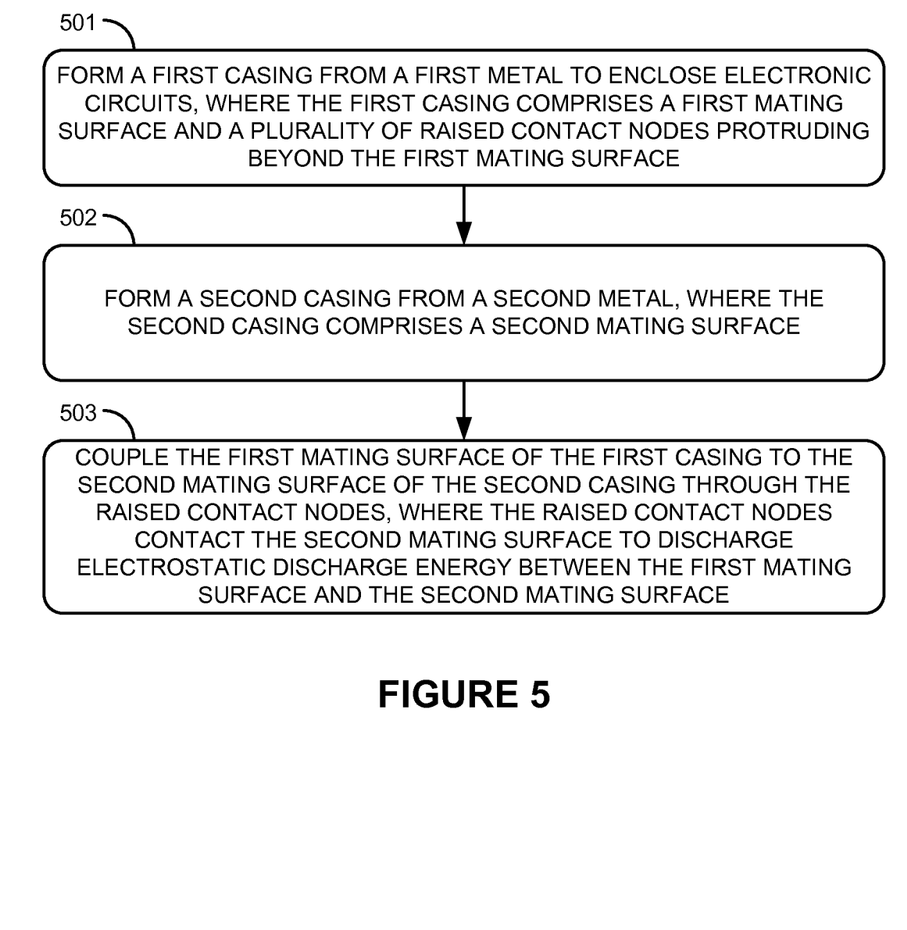
FIG. 5 is a flow diagram illustrating a method of manufacturing an equipment enclosure system.

FIG. 5 is a flow diagram illustrating a method of manufacturing an equipment enclosure system, such as equipment enclosure system 100, equipment enclosure system 300, or modular visualization display panel 600, although other configurations could be employed. The method of FIG. 5 could be employed in manufacturing a modular equipment enclosure system, such as a modular human-machine interface system, modular visualization display panel system, modular control panel, or other modular electronic enclosure system.

In FIG. 5, operation 501 includes forming a first casing from a first metal to enclose electronic circuits, where the first casing comprises a first mating surface and a plurality of raised contact nodes protruding beyond the first mating surface. In some examples, the first casing is machined from a bulk piece of material, such as a metal or metal alloy. In other examples, the first casing is cast in a mold using a metal or metal alloy. The first casing could include a hollow portion to encase or otherwise contain electronic circuitry, mechanical equipment, or other user-interface, processing, or communication equipment. The first mating surface could be any of the surfaces of the first casing, intended for mating or joining with another casing, mounting plate, or module, to form a stacked configuration with the first casing.

The plurality of raised contact nodes are disposed over the first mating surface, and configured to protrude above the first mating surface. The raised contact nodes could be raised protrusions, bumps, or other localized individual protrusions above the first mating surface. In typical examples, the raised contact nodes are disposed along a single outer edge of along the perimeter of the first mating surface. In further examples, the raised contact nodes are disposed along multiple edges of the first mating surface, or along the entire perimeter of the first mating surface. Raised contact nodes could also be disposed along internal portions of the first mating surface. The raised contact nodes could be formed from the first mating surface, such as being formed from the same bulk material as the first mating surface or the first casing, and thus could comprise the same metal or metal alloy. In examples of machining, the raised contact nodes would be machined from the same bulk piece of material, such as with a lathe or computer-aided machining equipment. In examples of casting, impressions of the raised contact nodes could be integrated into the mold so as to form from the same material as the first casing when the material is injected into the mold. In yet further examples, the raised contact nodes are formed separately from the first mating surface or the first casing and attached to the first mating surface, such as using fasteners, conductive adhesive, welds, solder, or other electrically conductive attachment techniques. In even further examples, the raised contact nodes could be formed from welds or solder material itself.

Operation 502 includes forming a second casing from a second metal, where the second casing comprises a second mating surface. In some examples, the second casing is machined from a bulk piece of material, such as a metal or metal alloy. In other examples, the second casing is cast in a mold using a metal or metal alloy. As with the first casing, the second casing could include a hollow portion to encase or otherwise contain electronic circuitry, mechanical equipment, or other user-interface, processing, or communication equipment. The second mating surface could be any of the surfaces of the second casing, intended for mating or joining with another casing, mounting plate, or module, to form a stacked configuration with the second casing.

Operation 503 includes coupling the first mating surface of the first casing to the second mating surface of the second casing through the raised contact nodes, where the raised contact nodes contact the second mating surface to discharge electrostatic discharge energy between the first mating surface and the second mating surface. The first casing is joined to the second casing in a stacked configuration in this example, where the first casing joins to the second casing at the associated mating surfaces. The first casing and the second casing could be joined to each other by fasteners, such as screws, or by an adhesive, weld, or other coupling devices or materials, including combinations thereof. The raised contact nodes of the first mating surface conductively contact the second mating surface, and thus conductively couple the first mating surface to the second mating surface. Other points of conductive contact could exist between the first mating surface and the second mating surface. However, the raised contact nodes typically provide a less-resistive path or a more repeatable conductive path for electrical contact between the two surfaces.

In some examples, the raised contact nodes are configured to deform the second mating surface when the first casing is coupled to the second mating surface. In further examples, the raised contact nodes are configured to penetrate the second mating surface when the first casing is coupled to the second mating surface. The penetration depth could be partial or total into the second mating surface. The second mating surface could comprise a non-conductive layer deposited over a conductive layer, such as a coating, paint, anodized layer, or other non-conductive layer over a metal or metal alloy. In examples of a partial penetration depth, the raised contact nodes could be configured to penetrate the non-conductive layer of the second mating surface, such as a coating, paint, anodized layer, or other non-conductive layer, and make electrical contact with another layer of the second mating surface, such as the underlying bulk conductive material of the second casing.

The material composition of any of the first casing, first mating surface, second casing, second mating surface, or raised contact nodes could each comprise any conductive material, such as such as a metal, a metal alloy, composite material, laminated material, or could comprise polymers or other non-conductive materials impregnated with conductive particles, fibers, or plates. The metal or metal alloys could include aluminum, magnesium, iron, steel, zinc, beryllium, or any other electrically conductive metal, alloy, or composite material, including combinations thereof.

In further examples, the first mating surface and the second mating surface are each comprised of different metal compositions. The different metal compositions could be susceptible to galvanic corrosion, such as when using dissimilar metals. The raised contact nodes could be comprised of an intermediate material composition, and a different composition than both the first mating surface and the second mating surface. The composition of the raised contact nodes could include a metal or metal alloy which is compatible with both the first mating surface and the second mating surface, thus acting as a conductive buffer between the dissimilar metals of the first mating surface and the second mating surface. The raised contact nodes could thus prevent or reduce galvanic corrosion of the first mating surface or second mating surface. Also, redox potentials could be brought closer by the material selection discussed herein to ensure that galvanic corrosion will be minimized. When a different material composition is used for the raised contact nodes, the raised contact nodes could be formed separately from the first mating surface and attached with welds, conductive adhesives, solder, or other attachment techniques.

The raised contact nodes are employed to transfer ESD energy from the first mating surface to the second mating surface, and likewise from the first casing to the second casing. Furthermore, the raised contact nodes are employed to disperse the ESD energy over multiple discharge paths. The raised contact nodes can augment other ESD protection schemes, which could include mechanical elements such as conductive gaskets, conductive meshes, conductive fingers, or electrical protection devices such as transient voltage suppression (TVS) diodes, varistors, gas discharge tubes, capacitors, resistors, inductors, or other mechanical or electrical electronic transient protection schemes and elements, including combinations thereof.

Figure 6:
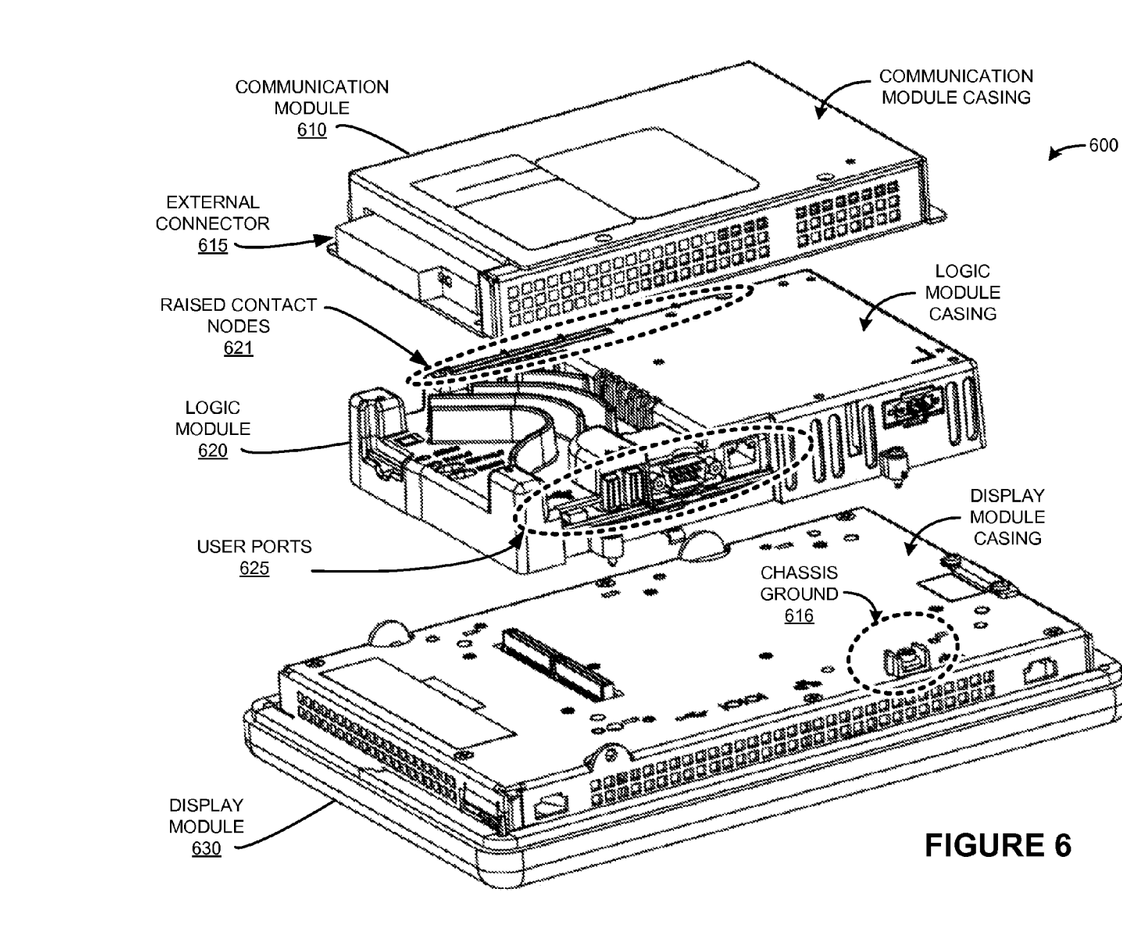
FIG. 6 is a system diagram illustrating an oblique projection of an example of a modular visualization display panel.

FIG. 6 is a system diagram illustrating a modular visualization display panel 600. Modular visualization display panel 600 is a modular equipment enclosure system, which includes communication module 610, logic module 620, and display module 630. Communication module 610, logic module 620, and display module 630 join together in a stackable configuration, where each module joins with another along opposing mating surfaces. Although three modules are shown in FIG. 6, modular visualization display panel 600 could include further stacked modules or different modules. Also, FIG. 6 shows modular visualization display panel 600 in an exploded view for clarity, and the individual modules would be joined closely to each other in normal usage. Each module of modular visualization display panel 600 includes a casing which surrounds internal components of each module. The individual casings also include holes for ventilation and inter-module fasteners. It should be understood that the naming of each module is merely for clarity and should not imply a necessary function of the module.

In this example, logic module 620 includes electronic logic portions, such as processing system portions or user-interface portions and also includes raised contact nodes 621 and user ports 625. The electronic logic portions of logic module 620 are encased in a casing of logic module 620, which comprises a metallic material, such as aluminum. Serpentine air ventilation channels are also formed from the casing of logic module 621, as shown on the left top side of logic module 620. It should be understood that other examples may lack the ventilation channels.

The casing of logic module 620 includes user ports 625. User ports 625 are user-accessible connections for peripheral devices, such as for connecting a keyboard, mouse, storage device, network cable, serial cable, or other peripherals for use with modular visualization display panel 600. Each of user ports 625 includes a conductive surround or shield portion which allows for a conductive physical connection between grounding elements of user ports 625 with the case of logic module 620, such as a metallic shield surrounding the signaling pins, power pins, or electrical contacts of user ports 625.

The casing of logic module 620 also includes raised contact nodes 621. Raised contact nodes 621 are disposed at periodic points along a rim of logic module 620 which mates with communication module 610. In FIG. 6, raised contact nodes 621 are disposed on the far, top edge of logic module 620, from the perspective of the observer. Also, raised contact nodes 621 are disposed along the longest edge mating to communication module 610, although other configurations could be used. Raised contact nodes 621 are positioned along the most ESD vulnerable side of logic module 620 in this example, and positioned near the edge of the casing to redirect ESD energy away from vulnerable internal areas. Logic module 620 and communication module 610 join together in a stackable configuration, and couple through raised contact nodes 621. Raised contact nodes 621 allow communication module 610 and logic module 620 to electrically interface through raised contact nodes 621, and to improve contiguous mating by reducing gaps between the two mated modules. When logic module 620 and communication module 610 are joined together, electrostatic discharge (ESD) energy received by logic module 620 is at least partially dispersed over at least one of raised contact nodes 621 to communication module 610. Raised contact nodes 621 each comprise halved teardrop-shaped raised protrusions which protrude above the surface of logic module 620 which mates with communication module 610. Raised contact nodes 621 are each formed from the same material as the casing of logic module 621, such as being machined from the same piece of material or formed in the same casting. Raised contact nodes 621, and likewise the casing of logic module 621, comprise a conductive material, such as a metal composition. The conductive material could also be of the same composition as the casing of communication module 610, or a different composition.

Communication module 610 also encloses electronic circuit portions, which may include similar or different types of electronic circuit portions as logic module 620. Communication module 610 interfaces elements of logic module 620 to further systems and equipment through external connector 615. A metallic surround or shroud of external connector 615 is electrically bonded to the casing of communication module 610, or could be formed of the same bulk material as communication module 610. In operation, an external cable could be connected to external connector 615 for interfacing modular visualization display panel 600 to other systems and equipment. A ground wire, shield, braid, or other conductive coupling could provide an electrical ground connection to external connector 615 and likewise to the casing of communication module 610. When ESD energy is received at the casing of communication module 610, the ESD energy is conducted by communication module 610 to external connector 615 for discharge to a ground potential.

Display module 630 encloses electronic circuit portions, a display screen, or other visual user interface elements of modular visualization display panel 600. In operation, a user of modular visualization display panel 600 would view the display screen of display module 630 and possibly interact with a display screen, touchscreen, buttons, dials, or other user interface elements associated with modular visualization display panel 600. Display module 630 joins with logic module 620 and communication module 610 in a stackable configuration to form modular visualization display panel 600. The casing of display module 630 includes chassis ground 616. In operation, an external cable could be connected to chassis ground 616 for interfacing modular visualization display panel 600 to a chassis ground electrical potential. A ground wire, shield, braid, or other conductive coupling could provide an electrical chassis ground connection to chassis ground 616 and likewise to the casing of display module 630. When ESD energy is received at the casing of display module 630, the ESD energy is conducted by display module 630 to chassis ground 616 for discharge to a ground potential. In this example, logic module 620 and display module 630 are mated by several screws.

In operation, an ESD source could discharge ESD energy to any of user ports 625. Sources of ESD energy could include humans, clothing, cabling, connectors, equipment, or other environmental sources. In this example, the ESD energy discharged at user ports 625 would be conducted through a shield or surround portion of user ports 625 to the casing of logic module 620. The casing of logic module 620 includes raised contact nodes 621, which contact the casing of communication module 610, and at least a portion of the ESD energy is dispersed by at least one of raised contact nodes 621 to the casing of communication module 610. The ESD energy could be further discharged through communication module 610, such as along the outer case surface of communication module 610 to external connector 615. It should be understood that other electrostatic discharge paths be taken by ESD energy, such as to display module 630 and chassis ground 616, although in this example, at least a portion of the ESD energy would be directed along at least one of raised contact nodes 621 when traversing between logic module 620 and communication module 610.

Raised contact nodes 621 provide a way to redirect ESD energy safely around critical components of logic module 620, and utilize the casing of logic module 620 to provide the ESD protection. By using multiple raised contact nodes, placed periodically along the rim of logic module 620, ESD energy can be disbursed along controlled, parallel paths, instead of a single path, a serial path, or unintentional paths through sensitive or vulnerable electrical components. Although raised contact nodes 621 could be augmented by further ESD protection devices and techniques, such as gaskets, foams, wide chassis ground interfaces, and distributed chassis to ground capacitances, these additional devices and techniques are not required in the examples herein.

Furthermore, by directing ESD energy across multiple ones of raised contact nodes 621, even if the ESD energy still takes a path through sensitive electrical components of communication module 610 or logic module 620, the total ESD energy would be dispersed or divided amongst the multiple ESD paths induced by the multiple ones of raised contact nodes 621. As a further example, ESD energy could be designed to traverse sensitive electrical components, such as through electrical components of communication module 610 or logic module 620, but since the ESD energy is dispersed across multiple ones of raised contact nodes 621, the individual portion of the ESD energy experienced by any individual electrical component is low enough to be within the ESD tolerances of the individual electrical components. Thus, multiple electrical components could share the total ESD energy as divided or dispersed by raised contact nodes 621 across a larger distance.

The spacing of raised contact nodes 621 is determined at a distance that minimizes current flow in any one area of logic module 620 or communication module 610, where the current flow is induced from ESD events. For example, the distance between raised contact nodes 621 could be optimized for a separation that allows for surface variation and energy dispersion. The height of raised contact nodes 621 is determined to avoid excessive standoff or vertical height between modules and of the contact nodes themselves, while still ensuring good physical and electrical contact between modules. The height of raised contact nodes 621 could be chosen to optimize contact pressure between modules. For example, within tolerances of the logic module casing and the communication module casing, the height of raised contact nodes 621 could be selected to provide proper seating of any mating electrical connectors between the modules.

Advantageously, raised contact nodes 621 can decrease the susceptibility of modular visualization display panel 600 to ESD events, while minimizing impact on the packaging associated with the individual modules. Raised contact nodes 621 provide energy guidance and dispersion to minimize ESD aggression toward critical circuit operation. Furthermore, extra parts and equipment for ESD protection can be reduced or eliminated by utilizing raised contact nodes 621 to coerce ESD energy along predetermined paths and along the casings and mating surfaces of individual modules. By reducing the need for specialized parts such as gaskets, foams, and discrete electrical protection components, modular visualization display panel 600 is better suited to extreme environments, such as industrial, chemical, or marine environments for machine equipment automation and control.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A modular electrical assembly, comprising:
 a modular stackup arrangement of the modular electrical assembly comprising a first enclosure that physically couples to a second enclosure to form the modular stackup arrangement, the first enclosure comprised of a first metal composition and having a connection to an electrical ground for at least discharging electrostatic discharge (ESD) energy of ESD events of the modular electrical assembly;
 the first enclosure configured to enclose first circuitry and comprising at least one generally flat surface to electrically couple to the second enclosure for at least receiving portions of the ESD energy received at the second enclosure;
 the second enclosure comprised of a second metal composition and configured to enclose second circuitry and having at least one surface with a plurality of raised contact nodes arranged on the one surface of the second enclosure such that when in contact with the one generally flat surface of the first enclosure, at least the portions of the ESD energy is directed over ones of the raised contact nodes to the one generally flat surface of the first enclosure for discharging the portions of the ESD energy through the electrical ground of the first enclosure, wherein the plurality of raised contact nodes are comprised of a third metal composition different than that of the first and second metal composition.

2. The modular electrical assembly of claim 1 wherein the modular stackup arrangement is connected to a modular visualization panel.

3. The modular electrical assembly of claim 1 wherein the plurality of raised contact nodes are disposed along a first edge of the one surface of the second enclosure.

4. The module electrical assembly of claim 3 wherein the first edge comprises an edge with the largest gapping between the one surface of the second enclosure and the one generally flat surface of the first enclosure.

5. The modular electrical assembly of claim 1 wherein the plurality of raised contact nodes are disposed along multiple edges of the one surface of the second enclosure.

6. The modular electrical assembly of claim 1 wherein the first circuitry comprises logic circuitry.

7. The modular electrical assembly of claim 1 wherein the second circuitry comprises communication circuitry.

8. The modular electrical assembly of claim 1 wherein the second enclosure and the plurality of raised contact nodes are formed from the same piece of material.

9. The modular electrical assembly of claim 1 further comprising:
   a second modular stackup arrangement of the modular electrical assembly comprising a third enclosure that physically couples to a fourth enclosure to form the second modular stackup arrangement.

10. A modular electrical assembly, comprising:
   a modular stackup arrangement of the modular electrical assembly comprising a first enclosure comprised of a first metal composition and that physically couples to a second enclosure comprised of a second metal composition to form the modular stackup arrangement, the first enclosure having a connection to an electrical ground for at least discharging electrostatic discharge (ESD) energy of ESD events of the modular electrical assembly;
   the first enclosure configured to enclose first circuitry and having at least one surface with a plurality of raised contact nodes arranged on the one surface of the first enclosure such that when in contact with a generally flat surface of the second enclosure, at least portions of the ESD energy received at the second enclosure is directed over ones of the raised contact nodes from the generally flat surface of the second enclosure for discharging the portions of the ESD energy through the electrical ground of the first enclosure, wherein the plurality of raised contact nodes are comprised of a third metal composition different than that of the first and second metal composition.

11. The modular electrical assembly of claim 10 wherein the modular stackup arrangement is connected to a modular visualization panel.

12. The modular electrical assembly of claim 10 wherein the plurality of raised contact nodes are disposed along a first edge of the one surface of the first enclosure.

13. The module electrical assembly of claim 12 wherein the first edge comprises an edge with the largest gapping between the one surface of the first enclosure and the one generally flat surface of the second enclosure.

14. The modular electrical assembly of claim 10 wherein the plurality of raised contact nodes are disposed along multiple edges of the one surface of the first enclosure.

15. The modular electrical assembly of claim 10 wherein the first circuitry comprises logic circuitry.

16. The modular electrical assembly of claim 10 wherein the second enclosure is configured to enclose second circuitry.

17. The modular electrical assembly of claim 10 wherein the first enclosure and the plurality of raised contact nodes are formed from the same piece of material.

18. The modular electrical assembly of claim 10 further comprising: a second modular stackup arrangement of the modular electrical assembly comprising a third enclosure that physically couples to a fourth enclosure to form the second modular stackup arrangement.

* * * * *